US009644829B2

(12) United States Patent
McAlpin

(10) Patent No.: US 9,644,829 B2
(45) Date of Patent: May 9, 2017

(54) SYSTEMS AND METHODS FOR PROVIDING A FIELD REPAIRABLE LIGHT FIXTURE WITH A HOUSING THAT DISSIPATES HEAT

(71) Applicant: XtraLight Manufacturing, Ltd, Houston, TX (US)

(72) Inventor: Ken McAlpin, Hitchcock, TX (US)

(73) Assignee: XtraLight Manufacturing, Ltd., Houston, TX (US)

( * ) Notice: Subject to any disclaimer, the term of this patent is extended or adjusted under 35 U.S.C. 154(b) by 742 days.

(21) Appl. No.: 13/870,642

(22) Filed: Apr. 25, 2013

(65) Prior Publication Data

US 2013/0235584 A1    Sep. 12, 2013

(51) Int. Cl.

| F21V 23/00 | (2015.01) |
|---|---|
| F21V 29/00 | (2015.01) |
| H05K 1/02 | (2006.01) |
| F21V 29/507 | (2015.01) |
| F21V 29/70 | (2015.01) |

(Continued)

(52) U.S. Cl.
CPC ............ *F21V 29/22* (2013.01); *F21V 23/006* (2013.01); *F21V 23/009* (2013.01); *F21V 29/507* (2015.01); *F21V 29/70* (2015.01); *H05K 1/0207* (2013.01); *H05K 1/0209* (2013.01); *F21V 5/04* (2013.01); *F21V 5/045* (2013.01); *F21W 2131/10* (2013.01); *F21Y 2101/00* (2013.01); *F21Y 2103/00* (2013.01); *F21Y 2105/00* (2013.01); *F21Y 2105/10* (2016.08); *F21Y 2115/10* (2016.08); *F21Y 2115/15* (2016.08); *H05K 2201/10106* (2013.01)

(58) Field of Classification Search
CPC ...... F21V 23/006; F21V 29/507; F21V 29/70; F21V 5/04; F21V 5/045; H05K 1/0207; H05K 1/0209; H05K 2201/10106; F21W 2131/10; F21Y 2101/02; F21Y 2105/001; F21Y 2103/00; F21Y 2105/008
USPC ..... 362/249.01, 249.02, 294, 373, 362, 800; 313/11, 46
See application file for complete search history.

(56) References Cited

U.S. PATENT DOCUMENTS

| 2,938,068 A | 5/1960 | Silverschotz |
|---|---|---|
| 3,346,755 A | 10/1967 | Christiansen |

(Continued)

*Primary Examiner* — Donald Raleigh
*Assistant Examiner* — Kevin Quarterman
(74) *Attorney, Agent, or Firm* — Norton Rose Fulbright US LLP

(57) ABSTRACT

Systems and methods disclosed herein provide one or more light emitting diode (LED) lighting fixture, which effectively dissipate heat. Embodiments include one or more printed circuit board (PCB) each having a front surface and a back surface, wherein the front surface may comprise strategically spaced LEDs and one or more thermal heat dissipaters, which draw heat away from the LEDs. The back surface may comprise one or more thermal heat dissipaters, covering a substantial portion of the back surface, wherein the back surface thermal heat dissipaters are thermally connected to the front surface thermal heat dissipaters. The LED fixture may also comprise one or more drivers which drive the PCB. The PCB and driver may be housed within a PCB chamber and a driver chamber, respectively, of a housing fixture, which may provide heat dissipation, structural support, and environmental protection for the components housed therein.

17 Claims, 4 Drawing Sheets

(51) Int. Cl.
  *F21V 5/04*     (2006.01)
  *F21W 131/10*   (2006.01)
  *F21Y 103/00*   (2016.01)
  *F21Y 101/00*   (2016.01)
  *F21Y 105/00*   (2016.01)
  *F21Y 105/10*   (2016.01)
  *F21Y 115/10*   (2016.01)
  *F21Y 115/15*   (2016.01)

(56) References Cited

U.S. PATENT DOCUMENTS

| | | |
|---|---|---|
| 4,999,936 A | 3/1991 | Calamia et al. |
| 5,568,361 A | 10/1996 | Ward et al. |
| 5,856,029 A | 1/1999 | Burrows |
| 6,045,240 A * | 4/2000 | Hochstein ............ B60Q 1/2696 |
| | | 362/249.06 |
| 6,188,028 B1 | 2/2001 | Haba et al. |
| 6,422,716 B2 | 7/2002 | Henrici et al. |
| 6,696,786 B2 | 2/2004 | Burrows |
| 6,712,486 B1 * | 3/2004 | Popovich ............... A47C 7/725 |
| | | 361/719 |
| 6,851,831 B2 | 2/2005 | Karlicek, Jr. |
| 6,891,200 B2 | 5/2005 | Nagai et al. |
| 7,572,031 B2 | 8/2009 | Schultz et al. |
| 7,591,649 B2 | 9/2009 | Yen et al. |
| 7,607,793 B2 | 10/2009 | Coushaine et al. |
| 7,621,655 B2 | 11/2009 | Roberts et al. |
| 7,710,045 B2 | 5/2010 | Schultz et al. |
| 7,744,266 B2 | 6/2010 | Higley et al. |
| 7,806,560 B2 | 10/2010 | Schultz et al. |
| 7,824,073 B2 | 11/2010 | Hsieh et al. |
| 7,886,861 B2 | 2/2011 | Custodis |
| 7,897,980 B2 | 3/2011 | Yuan et al. |
| 7,944,708 B2 | 5/2011 | Lin |
| 7,946,727 B2 | 5/2011 | Lee |
| 8,011,799 B2 | 9/2011 | Van Laanen et al. |
| 8,033,677 B1 * | 10/2011 | Olsson ................. F21V 7/0083 |
| | | 114/312 |
| 8,317,372 B2 * | 11/2012 | Fu ............................ F21V 3/00 |
| | | 313/46 |
| 8,322,906 B2 | 12/2012 | Caroom, Jr. et al. |
| 8,764,236 B2 | 7/2014 | Caroom, Jr. et al. |
| 2003/0002282 A1 * | 1/2003 | Swaris ................ G09F 13/0404 |
| | | 362/249.06 |
| 2004/0184272 A1 | 9/2004 | Wright et al. |
| 2007/0273290 A1 | 11/2007 | Ashdown et al. |
| 2008/0037284 A1 | 2/2008 | Rudisill |
| 2008/0220549 A1 * | 9/2008 | Nall ...................... H05K 3/284 |
| | | 438/26 |
| 2008/0254649 A1 * | 10/2008 | Storey ...................... F21K 9/00 |
| | | 439/56 |
| 2010/0071936 A1 * | 3/2010 | Tan ...................... H05K 1/0204 |
| | | 174/252 |
| 2010/0099276 A1 | 4/2010 | Capeleto et al. |
| 2010/0226139 A1 * | 9/2010 | Lynch ...................... F21S 8/02 |
| | | 362/373 |
| 2011/0298371 A1 * | 12/2011 | Brandes ................ F21K 9/135 |
| | | 315/32 |
| 2012/0211773 A1 * | 8/2012 | Fleming .................. H01L 23/60 |
| | | 257/88 |
| 2012/0268936 A1 * | 10/2012 | Pickard ................... F21K 9/135 |
| | | 362/249.02 |
| 2012/0273963 A1 * | 11/2012 | Mirsky ................ H01L 23/3735 |
| | | 257/774 |
| 2013/0062633 A1 | 3/2013 | Demuynck |
| 2014/0009064 A1 * | 1/2014 | Kornitz .............. H05B 33/0803 |
| | | 315/53 |
| 2015/0049484 A1 * | 2/2015 | Preuschl ................ F21V 27/02 |
| | | 362/249.01 |

* cited by examiner

SYSTEMS AND METHODS FOR PROVIDING A FIELD REPAIRABLE LIGHT FIXTURE WITH A HOUSING THAT DISSIPATES HEAT

CROSS-REFERENCE TO RELATED APPLICATIONS

The present application is related to co-pending U.S. Pat. No. 8,322,906, filed on Aug. 8, 2011, the disclosure of which is incorporated herein by reference.

TECHNICAL FIELD

The present disclosure relates to light fixtures having a fixture housing which protects the light fixture's interior components from environmental damage and aids in the dissipation of internally generated heat.

BACKGROUND OF THE INVENTION

A recent development in the lighting system industry has been the introduction of light emitting diode (LED) lighting units. LED lighting units have grown in popularity because as compared traditional lighting sources such as incandescent lighting units, halogen lighting units and fluorescent lighting units, LEDs in ideal conditions are capable of outputting a larger amount of visible lumens per equivalent input power, are capable of delivering a substantially longer life time, and are capable of realizing substantial energy cost savings. However, due to external conditions involved in real world use of LED lighting units, as opposed to ideal conditions and/or laboratory conditions, it has proven difficult to realize the full benefits that LED lighting units provide over traditional lighting sources.

For example, overheating has been a recurring problem which occurs in real world environments and prevents LED lighting units from realizing their full potential. Often when an LED is exposed to too high of a temperature for too long of a time, the LED will fail prior to its reaching its rated life expectancy. As such, one of the most attractive attributes of the LED, its long life expectancy, is lost when overheating occurs. In another example, when an LED driver is exposed to too high of a temperature for too long of a time, the driver will fail prior to its reaching its life expectancy. Thus, for this additional reason, one of the most attractive attributes of LED lighting units, its long life expectancy, is again lost when overheating occurs.

Further, the overheating problem gets exacerbated in sealed lighting units because LEDs and LED drivers are themselves heat generating devices. As such, when the lighting unit is sealed, as is common in outdoor lighting units which are exposed to harsh elements such as rain, ice, and wind, the lighting unit and the components therein grow hotter and hotter as the components generate more and more heat which becomes trapped therein. As such, it has proven difficult to remedy the overheating problem in real world conditions.

As LED lighting units have evolved, the industry has attempted using secondary heat dissipating devices to lower the temperatures at and near LEDs, drivers, and other components (e.g. transformers, AC/DC converters, etc.), but secondary heat dissipating devices may be ineffective and/or cause problems of their own.

For example, some LED lighting units employ fans in an attempt to cool hot areas of the lighting unit. However, fans require additional energy to operate, add cost to the LED lighting unit, require additional space within the LED lighting unit thereby increasing the size of the ELD lighting unit, and as such add weight to the LED lighting unit. Further, fans comprise moving parts prone to mechanical failures that have proven to be frequent, which again shortens the LED lighting unit's life expectancy. Other examples are heat sinks, heat pipes, and the like. However, heat sinks, heat pipes and the like also add cost to the device, occupy a substantial amount of costly real estate within the unit, and add weight to the LED lighting unit. Adding weight and bulk to the LED lighting unit makes it cumbersome and is undesirable, especially when used for commercial purposes in difficult to reach places (e.g. 15 to 60 feet tall outdoor light poles). Other secondary heat dissipation devices include thermal gels and/or epoxies; however, gels and epoxies make it difficult to replace component parts of LED lighting units because the gels are messy and epoxies cause destruction when two affixed surfaces are decoupled from each other. Thus thermal gels and/or epoxies are undesirable because if one of the plurality of component parts of the LED lighting unit fails (e.g., one driver of a plurality of drivers), then the entire LED lighting unit has to be replaced as opposed to replacing only the failed component part of the LED lighting unit.

As such, there is a need in the lighting industry for a LED lighting fixture with new heat dissipating means which prevents the overheating of LEDs and other components but does not add substantial weight or cost to the LED lighting unit or occupy costly real estate of the lighting unit. Further, it is desirable that the heat dissipating means not involve mechanical parts. Further still, there is a need for a LED lighting fixture design that allows component parts to be repairable and replaceable in the field, in order to the save cost, size, and weight associated with the LED lighting fixture.

BRIEF SUMMARY OF THE INVENTION

Systems and methods to provide one or more light emitting diode (LED) lighting fixture, which effectively dissipates heat. Embodiments of the invention include one or more printed circuit board (PCB) each having a front surface and a back surface, wherein the front surface may comprise strategically spaced LEDs and one or more thermal heat dissipaters, which draw heat away from the LEDs. The back surface may comprise one or more thermal heat dissipaters, covering a substantial portion of the back surface, wherein the back surface thermal heat dissipaters are thermally connected to the front surface thermal heat dissipaters using one or more thermally conductive vias, which draw heat away from the front surface and towards the back surface of the PCB. The PCB may be housed within a PCB chamber of a housing fixture, which may provide structural support and environmental protection for the components housed within the housing. The PCB chamber is shaped such that the back surface thermal heat dissipaters are in substantial thermal connection with one or more surfaces of the housing fixture, and the thermal connection between the back surface thermal heat dissipaters and the housing operates to draw heat away from the PCB, and in some embodiments, transfer the heat to the environment outside of the housing. The PCB chamber may comprise one or more lenses on one or more portions of the PCB chamber, and the PCB chamber is further shaped such that the front surface of the PCB is in close proximity with at least one of the lenses, such that light emitted from the LEDs propagate through the one or more lenses and into the outside environment.

The housing fixture may also comprise one or more driver chambers, which may provide structural support and environmental protection, for drivers (and/or other control devices) that drive the one or more PCBs. The one or more drivers are in electrical connection with the PCBs, such that the one or more drivers may drive the PCBs; however, the drivers may be separated and distanced from the PCBs in order to provide thermal isolation between the PCBs and the one or more drivers. The housing may be shaped such that one or more portions of the driver chamber is in substantial thermal connection with the drivers, wherein the housing operates to draw heat away from the drivers, and in some embodiments, transfer the heat to the environment outside the housing. The housing may be configured such that the one or more driver chambers are integrated with the PCB chamber. In other embodiments, the housing may be configured such that the one or more driver chambers are removably connected with the PCB chamber.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
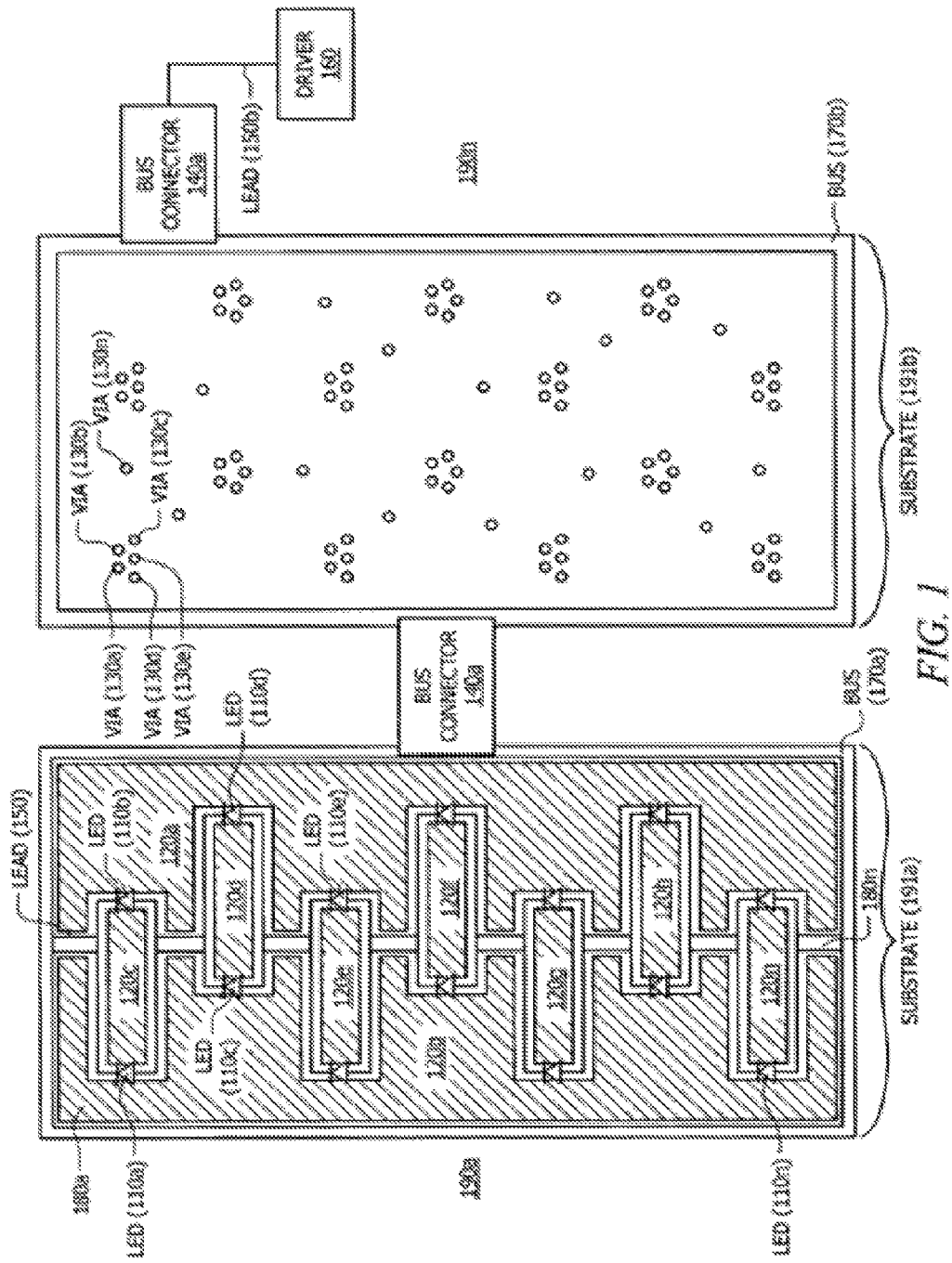
FIG. 1 shows embodiments of a front side of PCBs operable to provide illumination.

FIG. 1 shows embodiments of a front side of printed circuit boards (PCB) operable to provide illumination. FIG. 1 shows PCB 190a which comprises substrate 191a. Substrate 191a may be flexible and/or rigid and be made of any material commonly used in the semiconductor industry for example: mylar, polyimide, polyether ether ketone (PEEK), transparent conductive polyester film, fire resistant (e.g., FR-4, FR-6, metal clad) circuit board material, and/or the like. Substrate 191a may be an electrical and/or thermal insulator, and/or the like. Substrate 191a also may be of any color desired including colors that focus light, reflect light, colors that provide for specular or diffuse reflection, and/or any combination thereof. For example, substrate 191a may be white, which may aid in the diffusion of light. Substrate 191a of embodiments may be of any dimension (e.g., height, width, length) and shape (square, rectangular, triangular, symmetrical, asymmetrical, circular, spherical, obtuse, oblong, round, curved, bent, etc.). Various shapes and dimensions of substrate 191a may be selected for aesthetic reasons, lumen output reasons, heat dissipation reasons, power consumption reasons, light diffusion or focusing reasons, connection reasons and/or any combination thereof. Examples of various shapes are shown in commonly assigned, related U.S. Pat. No. 8,322,906, filed on Aug. 8, 2011, the disclosure of which is incorporated herein by reference.

PCB 190a comprises one or more light sources 110a-110n, which may comprise light emission technology such as a light emitting diode (LED) (such as may include: a phosphorus based LED, an organic light-emitting diode (OLED), a quantum dot LED, an LED array), an incandescent light source, a fluorescent light source, a neon light source, and/or the like, and/or any combination thereof according to embodiments of the invention. The embodiment illustrated in FIG. 1 shows light sources 110a-110n as being a plurality of LEDs. PCB 190a of embodiments may comprise a single light source 110a or a plurality of light sources 110a-110n (e.g., a plurality of LEDs or LED arrays). Light sources 110a-110n may be connected in series, in parallel, and/or series-parallel network configuration; as such, if one or more light source fails, the remaining light sources that are still operable continue to provide illumination. Light sources 110a-110n may be positioned at any angle on the board and emit light beams at any angle from the board (e.g., emit light straight out, sidewise, at an angle, etc.). The light output from light sources 110a-110n may be of any light temperature (e.g., cool or warm hues) and may be of any color including but not limited to white and colors in the visible and non-visible spectrum. A single light source could emit more than one color or could be limited to emit a single color. Individual light sources of a plurality of light sources 110a-110n may all be the same color or may be any combination of various colors. The light emitted from a plurality of light sources 110a-110n may be mixed and/or diffused if desired, wherein the mixed and/or diffused output may be of any color and/or temperature. As such, any number of any color combination of light sources 110a-110n may be used to create any temperature and any color in the visible or non-visible spectrum.

In embodiments, PCB 190a also comprises electrical bus 170a. Electrical bus 170a is disposed on substrate 191a, connects to light sources 110a-110n, and when powered on, electric bus 170a provides power to light sources 110a-110n. PCB 190a may also comprise one or more jumpers (not shown), which selectively completes or interrupts the circuit formed between electrical bus 170a and lights sources 110a-110n. As such, the jumpers may be used to turn PCB 190a on and off, and/or one or more respective light sources 110a-110n on and off.

Electrical bus 170a may also be used to connect PCB 190a to other devices, such as PCB 190n and driver 160. Moreover, electrical bus 170a may be adapted to facilitate connection between PCB 190*a* and other devices (e.g., PCB 190*n*) along any portion of the entire periphery of PCB 190*a*. Electrical bus 170*a* is operable to provide power, and in some embodiments, data communication to PCB 190*a*. In embodiments, one or more additional buses (not shown) may be disposed on PCB 190*a*, wherein power is provided over one or more of the busses and data communications are provided over one or more of the same or different busses. Whether PCB 190*a* includes one or more busses, power and data communications may be provided by driver 160, which is in electrical communication with PCB 190*a*. Bus connector 140*a* may be connected to electrical bus 170*a* in order to connect PCB 190*a* to other devices such as PCB 190*n*, driver 160, and more if desired. Bus connectors 140*a* and 140*b* may be non-permanent, replaceable, disposable, exchangeable, temporary, detachable, slidable, moveable, versatile, and dynamic. Because bus connectors 140*a* and 140*b* are able to provide a non-permanent connection to conductor bus 58, faulty components may be replaced easily during manufacture and in the field. For example, if PCB 190*a* and/or 190*n* fail, then in the field, the failed PCB may be disconnected easily from bus connector 140*a* and/or 140*b* and replaced with an operational PCB. Likewise, if one of more bus connector 140 fails, then in the field, the failed bus connector 140 may be disconnected and replaced with an operational bus connector. Further, if one or more drivers 160 fails, then in the field, bus conductor 140 *a* may be temporally disconnected to facilitate the replacement of failed driver 160.

As stated above, bus connectors 140*a* and 140*b* may operate to connect PCB 190*a* to one or more items. An example of a connectable item is driver 160 as shown in FIG. 1. Driver 160 may be any device capable of at least receiving an input of power, regulating the power as is appropriate, and outputting the regulated power for use in powering a lighting unit. An example of a driver 160 is an electrical ballast, a halogen light fixture power supply, LED driver, and/or the like. In embodiments, driver 160 is operable to receive an input from various power sources providing AC and/or DC input (e.g., a car, a generator, a wall outlet/socket, a power grid, a light switch, any type of battery, and/or the like). As such, driver 160 may comprise an AC/DC converter (and/or a DC/AC convertor) in order to convert an AC input into a DC output, or vice versa. Driver 160 may also comprise an electrical load through which the input may be stabilized and regulated such that the output is limited to a level that is appropriate for the particular lighting unit. Some lighting units may require more power than others (e.g., a lighting unit configured for outdoor stadium lighting as opposed to a lighting unit configured for a desk lamp). As such, the power output of driver 160 may vary according to the characteristics of a particular lighting unit and/or lighting fixture. In embodiments, bus connector 140*a* is operable to connect to one or more drivers 160 serially, in parallel, and/or in any combination thereof. If bus connector 140*a* is connected to more than one driver 160 in parallel, then if one of the drivers 160 fails, the drivers which remain operable and continue to provide power to PCB 190*a*, thereby providing redundancy.

As discussed, driver 160 may also provide data communication to PCBs 190*a*-190*b*. As such, driver 160 may comprise one or more processors (not shown), and/or driver 160 may be in communication with one or more processors. Data communicated by driver 160 to PCBs 190*a*-190*n* may include data operable to turn on and off one or more PCBs and/or one or more light sources 110*a*-110*n*. The PCBs and/or light sources 110*a*-110*n* may turn on and off according to a pattern, for example, in order to display a light show. The PCBs and/or light sources 110*a*-110*n* may turn on and off according to the time of day and/or the amount of ambient lights in the outside environment. For example, the PCBs and/or light sources 110*a*-110*n* may be programed to illuminate at night and not illuminate during the day, for example street lights. Driver 160 may comprise and/or be connected to a light detector (not shown) which detects an amount of ambient light in the environment. When the light detector detects a threshold amount of ambient light, driver 160 may communicate data to PCBs 190*a*-190*n* indicating that one or more of the PCBs and/or light sources 110*a*-110*n* should reduce its lumen output and/or power off. Driver 160 (and/or the one or more processors, not shown) may be connected to a communication network, such as the internet or an intranet, wherein programming code, threshold light values, threshold times, timers, and/or the like may be communicated, changed, and/or updated as is desired. Further, the PCBs and/or light sources 110*a*-110*n* may be remotely controlled (for example, the lumen output adjusted) using the communication network.

FIG. 1 shows the front side of PCBs 190*a* and PCB 190*n*. In embodiments, any number of PCBs may be connected together in any shape or design. In this example, PCB 190*a* comprises all the same components as PCB 190*n*, but in order to make the components easier to see, some components are not shown on PCB 190*a*, while some components are not shown on PCB 190*n*. In some embodiments, PCB 190*a* may have more or less components as compared to PCB 190*n*, as is desired.

PCB 190*a* comprises substrate 191*a* with one or more light sources 110*a*-110*n* disposed thereon. In embodiments, one or more of light sources 110*a*-110*n* are light emitting diodes (LED). Light sources 110*a*-110*n* are shown as being connected in series and parallel, as such, if one or more light source fails, the non-failing light sources continue to operate. Light sources 110*a*-110*n* are electrically connected to each other through electrical leads 150*a*. Electrical leads 150*a* are operable to transfer power and/or data to light sources 110*a*-110*n*. Electrical leads 150*a* are electrically connected to electrical bus 170*a*, and receive power and data therefrom.

Light sources 110*a*-110*n* generate heat, and if a light source 110 is exposed to too much heat for too long of a time, the light source will fail. As such, light sources 110*a*-110*n* have a light source threshold temperature, above which continued exposure to a temperature above the light source threshold temperature will cause a high probability that one or more of the light sources will fail. Generally, light source manufactures provide identify the threshold temperature above which the continued reliable operation of the light source is at risk. For instance, LED light source manufactures typically provide the maximum junction temperature for the LEDs in the light source's specifications. This threshold temperature is specific to each LED light source, and as an example, the light source threshold temperature may be as high as 150 degrees Celsius. Therefore, for long term viability of the light source, it is desirable that the light source's actual temperature be maintained below the light source's threshold temperature. As such, effective dissipation of heat prevents light source failures and prolongs the life of the light source. PCB 190*a* comprises several features which aid in the dissipation of heat in order to prevent one or more light sources 110*a*-110*n* from being exposed to temperatures above the light source threshold temperature, thereby prolonging the life of light sources 110*a*-110*n*.

For example, the light sources 110a-110n are strategically positioned a threshold distance away from each other. Light source 110a produces heat which naturally radiates away from lighting source 110a in a radial pattern. As heat radiates outwardly from a light source, the temperature of the heat lowers. However, when more than one light source 110a-110n are located near each other, the radial heat radiating from each light source radiate into each other and combine. As such, the further that a first light source 110a is distanced away from another light source 110b, the less heat exists at the locations that the heat of the two light sources intersect and combine. With this understanding of the heat radiation of a light source (e.g., LEDs of a particular power), a system and/or method may calculate the minimum threshold distance between which light sources 110a-110n may be located away from each other in order to prevent any one light source from being exposed to temperatures above the light source threshold temperature.

Another feature which aids in the dissipation of heat in order to prevent one or more light sources from being exposed to temperatures above the light source threshold temperature is thermal heat conduit 120 (shown with shaded lines in FIG. 1), which may be disposed upon substrate 191a of the front side of PCB 190a. Thermal heat conduit 120 is different from a heat sink because heat sinks are deep areas of conductive material which collect heat and slowly allow the collected heat to dissipate into the surrounding air. In contrast, thermal heat conduit 120 draws heat away from a heat source and transfers the heat to another thermally conductive material (e.g., one or more thermal conductive vias, one or more other thermal heat conduits, a thermally conductive housing, and/or the like). Further, while thermal heat conduit 120 may be thermally connected to a medium that dissipates heat into the surrounding air, thermal heat conduit 120 itself is a passageway that transfers heat away from a heat source to another thermally conductive medium that may or may not dissipate heat into the surrounding air. Also, thermal heat conduit 120 is different from a via because a via is a deep and narrow channel which connects one layer of a PCB board (e.g., the front side) to a different layer of a PCB (e.g, the back side or an interterm layer). In contrast, thermal heat conduit 120 is a shallow and wide surface material which is disposed on a single layer of a PCB (e.g., the front of a PCB or the back of a PCB). While a via may connect a thermal heat conduit 120 to a different layer of a PCB, the thermal heat conduit 120 itself is disposed a single layer thick and does not transcend multiple layers of a PCB. Further, Thermal heat conduit 120 is different from a mechanical heat dissipation device (e.g., a fan), because thermal heat conduit 120 comprises no moveable parts.

PCB 190a shows a plurality of thermal heat conduits 120a-120n which are operable to draw heat away from light sources 110a-110n at speeds that are quicker as compared to air. Thermal heat conduit 120 comprises thermal conductive material such as diamond, gold, silver, copper, aluminum, graphene, graphite, ceramic, iron, steel, tin and the like, and/or any combination thereof. Electric leads 150 and electric bus 170a are electrically isolated from thermal heat conduits 120a-120n in any manner sufficient to prevent thermal heat conduits 120a-120n from causing a short in PCB 190a (for example, using insulating material 180a-180n which may be disposed on substrate 191a, physically removing material from PCB 190a to prevent possible shorting or an electrical jump across the created gap).

Thermal heat conduits 120a-120n are disposed on substrate 191a such that a substantial portion of the front side of PCB 190a is occupied by thermal heat conduits 120a-120n. For example, every portion that is not occupied by electrical leads 150a, electrical bus 170a, and the components that provide electrical isolation may be occupied by thermal heat conduits 120a-120n. In other embodiments, electrical leads 150a and/or electrical bus 170a may not be disposed on substrate 191a (e.g., when wires extending out of PCB 190a are used), wherein thermal heat conduits 120a-120n may occupy up to 100% of substrate 191a. In other examples, any percentage between 35%-99% (inclusive) of substrate 191a may be occupied by thermal heat conduits 120a-120n.

The thermal conductivity and the coverage area of the various thermal heat conduits 120a-120n may affect the threshold distance discussed above. As such, systems and methods may use parameters associated with thermal heat conduits 120a-120n when calculating the threshold distance and determining where to locate light sources 110a-110n upon PCB 190a. Some examples of parameters that may be considered include the thermal conductivity of the conduit material, the coverage area of the conduit material, amount of energy being dissipated, type of light source and/or the like, and/or any combination thereof.

Another feature which aids in the dissipation of heat in order to prevent one or more light sources from being exposed to temperatures above the light source threshold temperature is heat dissipation vias 130a-130n. Vias 130a-130n are shown on PCB 190n, which does not show light sources 110a-110n or thermal heat conduits 120a-120n in order to make vias 130a-130n easier to see. In this embodiment, PCB 190n comprises light sources (not shown) and thermal conductive portions (not shown). Vias 130a-130n are operable to draw heat away from the light sources 110a-110n. Vias 130a-130n may be located directly beneath light sources 110a-110n, near light sources 110a-110n, radiating out from light sources 110a-110n, far away from light sources 110a-110n, and/or any combination thereof.

Figure 2:
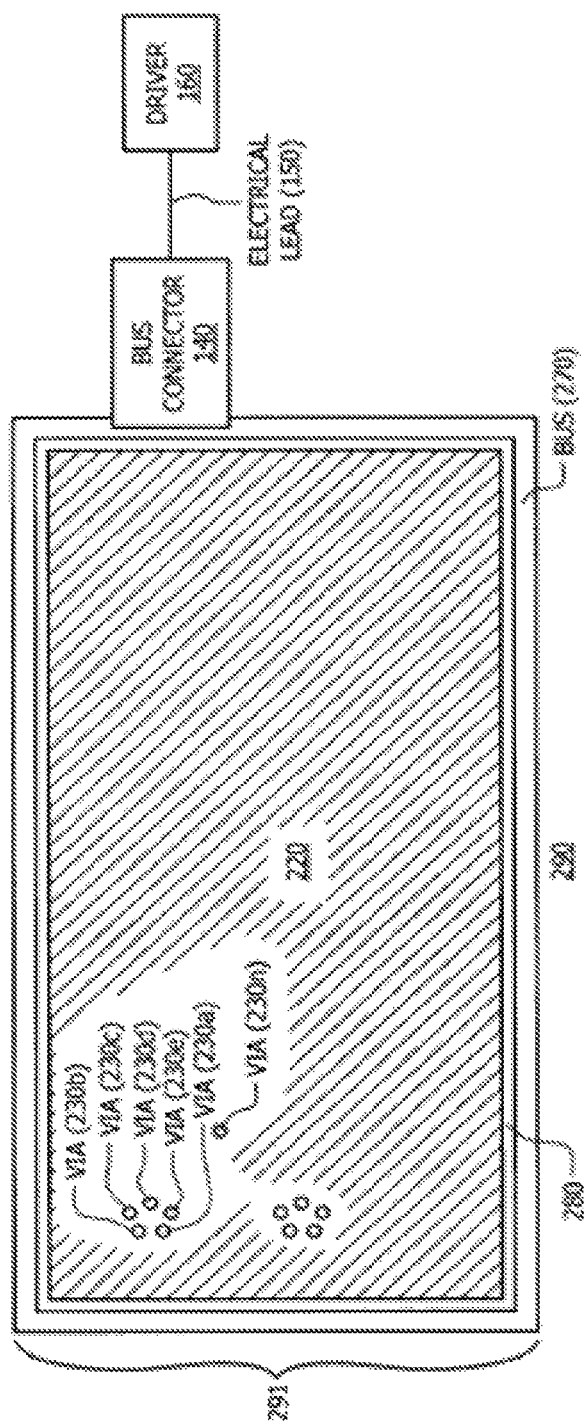
FIG. 2 shows an embodiment of the back side of a PCB operable to provide illumination.

Vias 130a-130n may be created in PCB 190n by drilling holes from the front side of PCB 190n to the back side of PCB 190n (as shown in FIG. 2). Vias 130a-130n may comprise thermal conductive material such as diamond, gold, silver, copper, aluminum, graphene, graphite, ceramic, iron, steel, tin and the like, and/or any combination thereof. Vias 130a-130n may be filled with thermal conductive material and/or lined with thermal conductive material, and/or any combination thereof. Some vias may comprise different thermal conductive material and/or the same thermal conductive material as compared to other vias. Some or all vias may comprise different thermal conductive material and/or the same thermal conductive material as compared to thermal heat conduits 120a-120n.

A threshold number of vias may be determined by systems or methods described herein. The threshold number of vias is the optimal number of vias such that there are not too many vias, in which case the additional vias provide no effective increase in further heat dissipation, or too few vias, in which cause the threshold distance (discussed above) will become longer. Too many vias adds no further benefit to the threshold distance and simply increases the manufacturing cost, and too few vias causes the threshold distance to become longer. As such, parameters of the light sources 110a-110n, parameters of the thermal heat conduits 120a-120n, and parameters of the vias may be used to determine the threshold number of vias. Some examples of parameters include the thermal conductivity of the materials selected, the coverage space of the materials selected, the amount of energy being dissipated, the impact of heat generated from one via on the adjacent via(s) and/or the like.

The thermal conductivity and the coverage area of the various vias 130a-130n may affect the threshold distance discussed above. As such, systems and methods may use parameters associated with vias 130a-130n when calculating the threshold distance and determining the locations of light sources 110a-110n upon PCB 190a. Some examples of parameters that may be considered include thermal conductivity of the material, the number vias selected, the amount of energy being dissipated, the impact of heat generated from one via on the adjacent via(s) and/or the like, and/or any combination thereof.

FIG. 2 shows another feature which aids in the dissipation of heat in order to prevent one or more light sources from being exposed to temperatures above the temperature threshold, namely thermal heat conduit 220, which is disposed on the back side of PCB 290. Thermal heat conduit 220 may be a single thermal conductive portion, as shown in FIG. 2, or a combination of more than one thermal conductive portion. Thermal heat conduit 220 is disposed upon substrate 291. Thermal heat conduit 220 is different from a heat sink because heat sinks are deep areas of conductive material which collect heat and slowly allow the collected heat to dissipate it into the surrounding air. In contrast, thermal heat conduit 120 draws heat away from a heat source and transfers the heat to another thermally conductive material (e.g., one or more thermal conductive vias, one or more other thermal heat conduits, a thermally conductive housing, and/or the like). While thermal heat conduit 220 may be thermally connected to a medium that dissipates heat into the surrounding air, thermal heat conduit 220 itself is a passageway that transfers heat away from a heat source to another thermally conductive medium that may or may not dissipate heat into the surrounding air. Also, thermal heat conduit 220 is different from a via because a via is a deep and narrow channel which connects one layer of a PCB board (e.g., the front side) to a different layer of a PCB (e.g, the back side or an interterm layer). In contrast, thermal heat conduit 220 is a shallow and wide surface material which is disposed on a single layer of a PCB (e.g., the front of a PCB or the back of a PCB). While a via may connect a thermal heat conduit 220 to a different layer of a PCB, the thermal heat conduit 220 itself is disposed a single layer thick and does not transcend multiple layers of a PCB. Further, thermal heat conduit 220 is different from a mechanical heat dissipation device (e.g., a fan), because thermal heat conduit 220 comprises no moveable parts.

Thermal heat conduit 220 comprises thermal conductive material such as diamond, gold, silver, copper, aluminum, graphene, ceramic, iron, steel, tin MORE and the like, and/or any combination thereof. Electric bus 270 is electrically isolated from thermal heat conduit 220 in any manner sufficient to prevent thermal heat conduit 220 from causing a short in PCB 290 (for example, using electrical insulating material 280 which is disposed on substrate 291 or, physically removing material from PCB 190a to prevent possible shorting or an electrical jump across the open space created by removing the material).

Thermal heat conduit 220 is disposed on substrate 291 such that a substantial portion of the back side of PCB 290 is occupied by thermal heat conduit 220. For example, every portion that is not occupied by electrical bus 270 and electrical insulating material 280 may be occupied by thermal heat conduit 220. In other embodiments, electrical bus 270 may not be disposed on substrate 291 (e.g., when wires extending out of PCB 290 are used), wherein thermal heat conduit 220 may occupy up to 100% of substrate 291. In other examples, any percentage between 50%-99% (inclusive) of substrate 291 may be occupied by thermal heat conduit 220.

Thermal heat conduit 220 may be thermally connected to thermal heat conduits 120a-120n using vias 230a-230n. In embodiments, each of thermal heat conduits 120a-120n are connected to thermal heat conduit 220 using at least one via. With such a configuration, heat generated by light sources 110a-110n travels away from light sources 110a-110n through thermal heat conduits 120a-120n, heat travels away from thermal heat conduits 120a-120n into vias 130a-130n, and heat travels away from vias 130a-130n into thermal heat conduit 220. Because each of thermal heat conduit 220, vias 230a-230n, and thermal heat conduits 120a-120n are operative to draw heat away from light sources 110a-110n, the threshold distance of the light sources 110a-110n may grow shorter due to the use of thermal heat conduit 220, vias 230a-230n, and thermal heat conduits 120a-120n.

The thermal conductivity and the coverage area of thermal heat conduit 220 may affect the threshold distance discussed above. As such, systems and methods may use parameters associated with thermal heat conduit 220 when calculating the threshold distance and determining the locations of light sources 110a-110n upon PCB 190a. Some examples of parameters that may be considered include thermal conductivity of the material, the coverage area of the material, the amount of energy being dissipated, the type of light source and/or the like, and/or any combination thereof.

Figure 3:
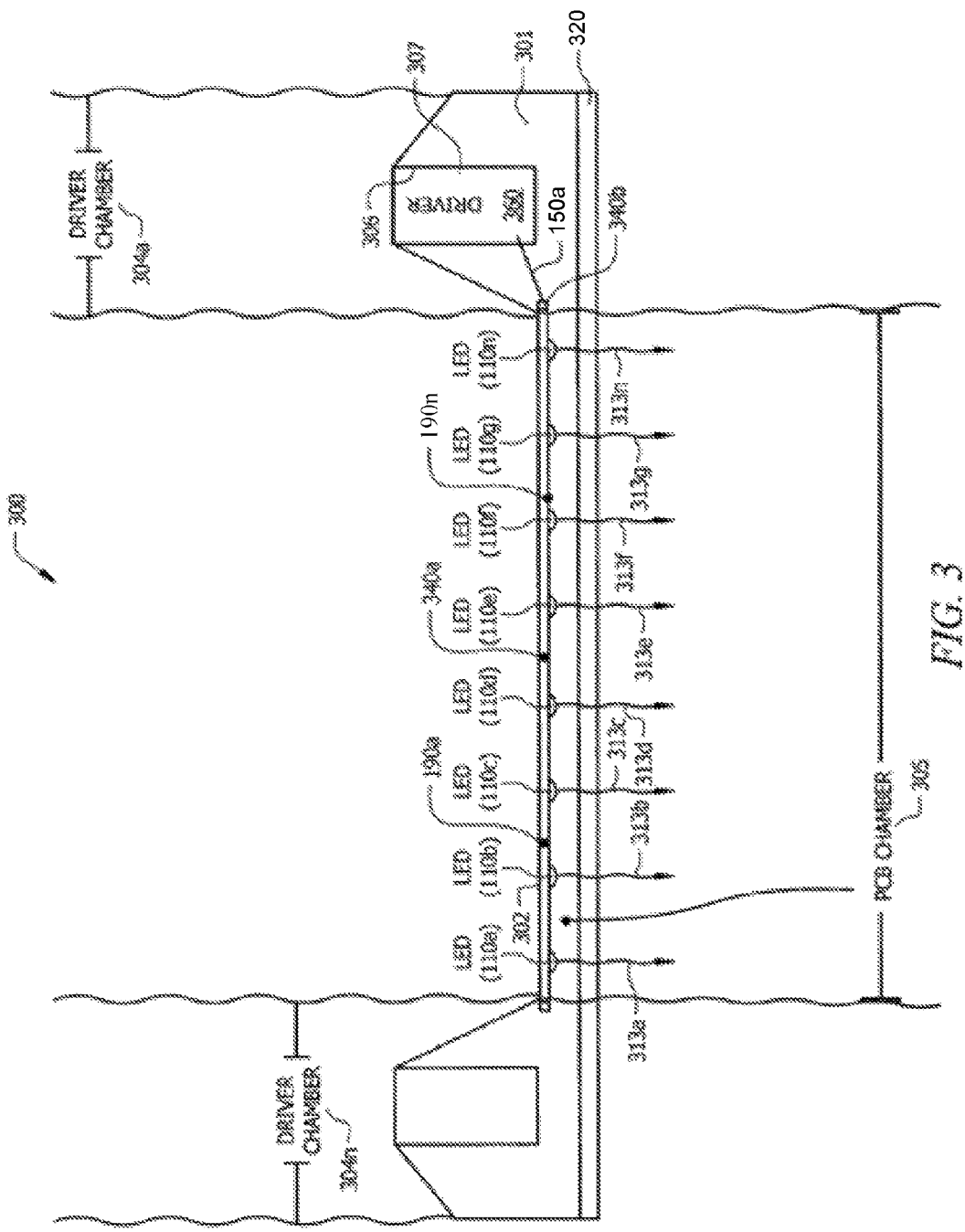
FIG. 3 shows a front view of an embodiment of a light fixture comprising a housing, a PCB chamber, and a driver chamber.

FIG. 3 shows another example feature which aids in the dissipation of heat in order to prevent one or more light sources from being exposed to temperatures above the temperature threshold, namely the housing 301 of light fixture 300. FIG. 3 shows light fixture 300 which houses one or more PCBs (e.g., 190a-190n), one or more drivers (e.g., driver 360), one or more bus connectors (e.g. 340a, 340b), and or other components which may be included into the lighting system (for example, one or more transformers, processors, network connections, power source connections, and/or the like). Light fixture 300 at a minimum provides structural support for the components housed therein and may protect the components therein from the outside environment. In embodiments, light fixture 300 may be an outdoor lighting fixture. In embodiments, the light fixture may be a closed environment which may be waterproof, air sealed, and/or otherwise sealed from the outside environment in order to protect the components from environmental damage. Of course, other lighting fixtures, such as indoor lighting fixtures, underwater lighting fixtures, and the like, may also be sealed lighting fixtures. When the light fixture is sealed as such, the dissipation of heat may become difficult because traditional closed environments tend to retain heat within the light fixture making it difficult to prevent the light fixture from reaching and exceeding the light source threshold temperature. Housing 301 of light fixture 300, which may or may not be sealed, aids in the dissipation of heat in order to prevent one or more components housed therein (for example, light sources, drivers, etc.) from being exposed to temperatures above their temperature threshold.

Light fixture 300 may comprise at least one PCB chamber 305. PCB chamber 305 houses the one or more PCBs and the PCB chamber's size may be adjusted to accommodate more or less PCBs. In this example, PCB chamber 305 is sized to accommodate two PCBs, PCB 190a and PCB 190n. The inside of PCB chamber 305 has a top surface and a bottom surface. The bottom surface of PCB chamber is made of lens 320 through which beams of light (e.g., light beams 313a-

313n) from LEDs 110a-110n pass through and provide illumination outside of light fixture 300. Lens 320 may be one or more lenses, and may be of any type of lens. For example, lens 320 may comprise diverging optics which are commonly utilized for aesthetic reasons (e.g., create ambient light) or collimating optics which is commonly utilized to gather light to meet a photometric specification (e.g., focus a light). In embodiments involving diverging optics, various optical features may be added alone or in combination to PCB 190a such as a filters, lenses, and/or the like (e.g., diffuse lenses, faceted lenses, rod lenses, pillow lens, an/or colored filters), which spread light into a more divergent beam pattern and may change the light's color. In embodiments involving collimating optics, various optical features may be added alone or in combination to a lighting module such as filters, shields, reflectors (e.g., reflector cavities, compound parabolic collectors, etc.), and/or Fresnel lenses (e.g., planoconvex lenses, dualconvex lenses, collapsed planoconvex lenses, etc.), which focus the light into a direction and may change the light's color.

The distance between lens 320 and PCBs 190a and 190n may be adjusted to focus light and/or maximize the output of light. In this example, lens 320 is positioned a short distance away from PCBs 190a and 190n in order to maximize the light output. Positioning lens 320 such a short distance away from PCBs 190a and 190n limits the room within PCB chamber 305, and as such, secondary heat dissipation devices such as fans, heat sinks, and the like may not have enough room to be housed within PCB chamber 305.

The inside of PCB chamber 305 also has a top surface, which is thermal conductive housing contact 302. Thermal conductive housing contact 302 is made of a thermal conductive material and aids in the dissipation of heat in order to prevent one or more light sources from being exposed to temperatures above the light source threshold temperature. Thermal conductive housing contact 302 may comprise diamond, gold, silver, copper, aluminum, graphene, graphite, ceramic, iron, steel, tin and the like, and/or any combination thereof. In preferred embodiments, thermal conductive housing contact 302 is in full contact with all of thermal heat conduit 220. In other embodiments, thermal conductive housing contact 302 is in contact with most of thermal heat conduit 220 or a substantial portion of thermal heat conduit 220. The thermal connection between thermal conductive housing contact 302 and thermal heat conduit 220 is made by pressing thermal conductive housing contact 302 and thermal heat conduit 220 against each other. The thermal connection may be maintained by affixing thermal conductive housing contact 302 and thermal heat conduit 220 to each other, for example by using one or more screws, bolts, fasteners, affixers, clamps, rivets, nails, secures, attaches, locks, holds, and/or the like, and/or any combination thereof. Further, the thermal connection may be maintained by affixing thermal conductive housing contact 302 and thermal heat conduit 220 to each other through pressure, seals, springs, vices, gravity, a vacuum, and/or the like, and/or any combination thereof.

In embodiments, the means of maintaining the thermal connection between thermal conductive housing contact 302 and thermal heat conduit 220 is non-permanent and removable thereby allowing one or more of housing 301, PCB chamber 305 (and/or a portion thereof), and/or one or more of PCBs to be replaced in the field. In traditional structures, when adhesive, thermal gels, epoxy, permanent fasteners and/or the like are used, the PCB may not be removed from the housing without substantially damaging the housing or PCB. In embodiments disclosed herein, by joining thermal conductive housing contact 302 and thermal heat conduit 220 with a non-permanent means, portions of light fixture 300 are repairable and replaceable in the field without damaging components of the light fixture 300.

In embodiments, thermal conductive housing contact 302 is in direct contact with thermal heat conduit 220, wherein there is no layer or substance of any kind between thermal conductive housing contact 302 and thermal heat conduit 220. In embodiments, thermal conductive housing contact 302 is in direct contact with thermal heat conduit 220, wherein the only substance between thermal conductive housing contact 302 and thermal heat conduit 220 is air. In embodiments, thermal conductive housing contact 302 is in direct contact with thermal heat conduit 220, wherein substrate 191a does not comprise a layer (e.g., a dielectric layer) above thermal heat conduit 220. In embodiments, thermal conductive housing contact 302 is in direct contact with thermal heat conduit 220, wherein thermal conductive housing contact 302 is not covered or coated with a layer (e.g., paint, dielectric layer, etc.). In embodiments, thermal conductive housing contact 302 is in direct contact with thermal heat conduit 220, wherein no thermal grease, adhesive, epoxy and/or the like is between thermal conductive housing contact 302 and thermal heat conduit 220. In embodiments, thermal conductive housing contact 302 is in direct contact with thermal heat conduit 220, wherein no mechanical device (e.g., a fan) is between thermal conductive housing contact 302 and thermal heat conduit 220. In embodiments, thermal conductive housing contact 302 is in direct contact with thermal heat conduit 220, wherein a layer of aluminum is located between thermal conductive housing contact 302 and thermal heat conduit 220.

In embodiments, thermal conductive housing contact 302 is in direct contact with thermal heat conduit 220, wherein only a layer of aluminum and air is located between thermal conductive housing contact 302 and thermal heat conduit 220. In embodiments, thermal conductive housing contact 302 is in direct contact with thermal heat conduit 220, wherein while the PCB is tinned over with solder, no other layer is located between thermal conductive housing contact 302 and thermal heat conduit 220 except, in some embodiments, an aluminum sheet and/or air. In embodiments, thermal conductive housing contact 302 is in direct contact with thermal heat conduit 220, wherein only a layer of copper is located between thermal conductive housing contact 302 and thermal heat conduit 220. In embodiments, thermal conductive housing contact 302 is in direct contact with thermal heat conduit 220, wherein only a layer of copper and air is located between thermal conductive housing contact 302 and thermal heat conduit 220. In embodiments, thermal conductive housing contact 302 is in direct contact with thermal heat conduit 220, wherein only a layer of thermal interface material (more commonly referred to as "TIM") is located between thermal conductive housing contact 302 and thermal heat conduit 220. In embodiments, no non-thermally conductive material is located between thermal conductive housing contact 302 and thermal heat conduit 220 such as paper, fiberboard, fiberglass, glass and/or any other such non-thermally conductive materials.

Because thermal conductive housing contact 302 is thermally conductive, thermal conductive housing contact 302 draws heat away from thermal heat conduit 220. Further, the outside portion of thermal conductive housing contact 302 is the outside of light fixture 300, as such, the outside portion of thermal conductive housing contact 302 is in direct contact with the ambient air (or other outside environment, for example, water) outside light fixture 300. Therefore, as thermal conductive housing contact 302 draws heat away from thermal heat conduit 220, thermal conductive housing contact 302 dissipates the heat into the outside environment (e.g., the ambient air, the surrounding water, and/or the like).

As such, example light fixture 300 shown in FIG. 3 may dissipate heat in the following manner: heat generated by light sources 110a-110n travels away from the light sources through thermal heat conduits 120a-120n, heat travels away from thermal heat conduits 120a-120n into vias 130a-130n, heat travels away from vias 130a-130n into thermal heat conduit 220, heat travels away from thermal heat conduit 220 into thermal conductive housing contact 302, wherein heat travels away from thermal conductive housing contact 302 by dissipating into the outside environment.

Because each of thermal conductive housing contact 302, thermal heat conduit 220, vias 230a-230n, and thermal heat conduits 120a-120n are operative to draw heat away from light sources 110a-110n, the threshold distance of the light sources 110a-110n may be contingent on the parameters of thermal conductive housing contact 302, thermal heat conduit 220, vias 230a-230n, and thermal heat conduits 120a-120n. Further, the threshold distance of light sources may be reduced through the selection of certain thermal conductive housing contact 302, thermal heat conduit 220, vias 230a-230n, and thermal heat conduits 120a-120n parameters. Some examples of parameters that may be considered include thermal conductivity of the material, the amount of contact between thermal conductive housing contact 302 and thermal heat conduit 220, the number vias selected, the energy being dissipated, the light source and/or the like, and/or any combination thereof.

Housing 301 of light fixture 300 also aids in the dissipation of heat in order to prevent components housed therein other than the light sources 110a-110n (for example, drivers, processors, wiring, network interfacing, etc.) from being exposed to temperatures above their respective temperature thresholds. For example, light fixture 300 may comprise one or more driver chambers 304a-304n. Light fixture 300 may be contiguous wherein driver chambers 304a-304n and PCB chamber 305 are a single contiguous structure. Alternatively, light fixture 300 may be manufactured in sections wherein driver chambers 304a-304n are separate sections which may be attached (or otherwise affixed) to PCB chamber 305 in order to create a configurable light fixture 300. A configurable light fixture 300 may be sealed from the outside environment or not sealed from the outside environment. When light fixture 300 is configurable, the size of light fixture 300 may be adjusted at manufacture and in the field.

During configuration, one or more PCB chambers 305 may be added or taken away from light fixture 300, as is desired, to adjust the number of PCBs which may be accommodated by light fixture 300. Further, one or more driver chambers 304a-304n may be added or taken away from light fixture 300, as is desired, to adjust the number of drivers (and/or other components) which may be accommodated by light fixture 300. Configurable light fixture 300 allows portions of housing 301 to be replaced in the field, making the light fixture 300 field replaceable. As such, if one or more portions of light fixture 300 becomes damaged, fails, or otherwise would benefit from repair or replacement, the one or more portions of light fixture 300 which would benefit from repair and/or replacement (e.g., one of the driver chambers) may be replaced and/or repaired in the field without necessitating repair and/or replacement of the other portions of light fixture 300.

Driver chambers 304a-304n may house various components of light fixture 300, such as one or more drivers, transformers, controllers, processors, network connections, and/or the like, and/or any combination thereof. Driver chambers 304a-304n are sized in order to accommodate the size of the components herein. For example, driver chamber 304a houses driver 360, and driver chamber 304a may be sized to accommodate the specific size of driver 360. Drivers, such as driver 360, generate heat, and if a driver 360 is exposed to too much heat for too long of a time, the driver may fail. As such, driver 360 has a driver threshold temperature, above which continued exposure to a temperature above the driver threshold temperature will cause a high probability that one or more of the drivers will fail. Some example driver threshold temperatures are 60 degrees Celsius, 90 degrees Celsius, and/or any temperature there between. As such, effective dissipation of heat is desirable to prevent driver failures and prolong the life of the luminary.

Driver chamber 304a may comprises several features which aid in the dissipation of heat in order to prevent one or more drivers (and/or other components housed within driver chamber 304) exposed to temperatures above the driver temperature threshold (and/or the other component temperature thresholds), thereby prolonging the life of the driver (and/or the other components). One such heat dissipation feature is thermal conductive housing contact 306, which may be located on the inside of driver chamber 304a. Thermal conductive housing contact 306 is similar to thermal conductive housing contact 302 and may begin on one or more of the interior walls drive chamber 307 and may extend outwardly towards the outside of driver chamber 304a. Thermal conductive housing contact 306 may comprise thermal conductive material such as diamond, gold, silver, copper, aluminum, graphene, graphite, ceramic, steel, iron, tin and the like, and/or any combination thereof. Thermal conductive housing contact 306 may make up an entire interior wall inside of driver chamber 307, or any portion thereof. Thermal conductive housing contact 306 may begin on all interior walls inside of driver chamber 307, or any number of interior walls inside of driver chamber 307.

In embodiments, thermal conductive housing contact 306 comes into contact with one or more portions of the components housed therein, for example driver 360, and draws heat therefrom. In preferred embodiments, thermal conductive housing contact 306 is in full contact with all of driver 360. In other embodiments, thermal conductive housing contact 306 is in contact with most of driver 360 or a substantial portion of driver 360. The thermal connection between thermal conductive housing contact 306 and driver 360 is made by pressing thermal conductive housing contact 306 and driver 360 against each other. The thermal connection may be maintained by affixing thermal conductive housing contact 306 and driver 360 to each other, for example by using one or more screws, bolts, fasteners, affixers, clamps, rivets, nails, secures, attaches, locks, holds, and/or the like, and/or any combination thereof. Further, the thermal connection may be maintained by affixing thermal conductive housing contact 306 and driver 360 to each other through pressure, seals, springs, vices, gravity, a vacuum, and/or the like, and/or any combination thereof.

In embodiments, the means of maintaining the thermal connection between thermal conductive housing contact 306 and driver 360 is non-permanent and removable thereby allowing one or more of housing 301, driver chamber 306 (and/or a portion thereof), and/or one or more of driver 360 and other components to be replaced in the field. In traditional structures, wherein adhesive, thermal gels, epoxy, permanent fasteners and/or the like are used, the internal components may not be removed from the housing without substantially damaging the housing or components. In embodiments disclosed herein, by joining thermal conductive housing contact 306 and driver 360 with a non-permanent means, portions of light fixture 300 are repairable and replaceable with easy in the field.

In embodiments, thermal conductive housing contact 306 is in direct contact with driver 360, wherein there is no layer or substance of any kind between thermal conductive housing contact 306 and driver 360. In embodiments, thermal conductive housing contact 306 is in direct contact with driver 360, wherein the only substance between thermal conductive housing contact 306 and driver 360 is air. In embodiments, thermal conductive housing contact 306 is in direct contact with driver 360, wherein the only substance between thermal conductive housing contact 306 and driver 360 is air and/or paint. In embodiments, thermal conductive housing contact 306 is in direct contact with driver 360, wherein thermal conductive housing contact 306 is not covered or coated with a layer (e.g., paint, dielectric layer, etc.). In embodiments, thermal conductive housing contact 306 is in direct contact with driver 360, wherein no thermal grease, adhesive, epoxy and/or the like is between thermal conductive housing contact 302 and thermal heat conduit 220.

In embodiments, thermal conductive housing contact 302 is in direct contact with thermal heat conduit 220, wherein only a layer of copper is located between thermal conductive housing contact 302 and thermal heat conduit 220. In embodiments, thermal conductive housing contact 302 is in direct contact with thermal heat conduit 220, wherein only a layer of copper and air is located between thermal conductive housing contact 302 and thermal heat conduit 220. In embodiments, thermal conductive housing contact 302 is in direct contact with thermal heat conduit 220, wherein only a layer of thermal interface material (more commonly referred to as "TIM") is located between thermal conductive housing contact 302 and thermal heat conduit 220. In embodiments, no non-thermally conductive material is located between thermal conductive housing contact 302 and thermal heat conduit 220 such as paper, fiberboard, fiberglass, glass and/or any other such non-thermally conductive materials.

Because thermal conductive housing contact 306 is thermally conductive, thermal conductive housing contact 306 draws heat away from driver 360. On some sides of driver chamber 304a, the outside portion of the thermal conductive housing contact 306 is the outside of light fixture 300, as such, the outside portion of thermal conductive housing contact 302 is in direct contact with the ambient air (or other outside environment, for example, water) outside light fixture 300. Therefore, as these portions of thermal conductive housing contact 306 draw heat away from driver 360, thermal conductive housing contact 306 dissipates the heat into the outside environment (e.g., the ambient air, the surrounding water, and/or the like).

On some sides of driver chamber 304a, the outside portion of the thermal conductive housing contact 306 is the inside portion of housing 301. For example, some portions of driver chamber 304a abut portions of PCB chamber 305. It is desirable that the heat dissipating from driver 306 be directed away from light sources 110a-110n, such that the heat from driver 360 is prevented from combining with the heat from light sources 110a-110n. Likewise, it is desirable that the heat dissipating from light sources 110a-110n be directed away from driver 360, such that the heat from light sources 110a-110n is prevented from combining with the heat from driver 360. As such, portions of driver chamber 304a may be thermally isolated from portions of PCB chamber 305. Such isolation may be accomplished through the use of thermal insulators, dielectrics, and/or the like, and/or any combination thereof. Further, a driver distance threshold may be determined and thereafter driver 360 may be located at a distance away from light sources 110a-110n, wherein the distance is equal to or greater than the driver distance threshold.

As such, another heat dissipation feature of light fixture 300 is the location of components housed within driver chamber 360. With the understanding of the heat radiation of components within PCB chamber 305 and the heat radiation of components within driver chamber 304a, a system and/or method may calculate a minimum threshold distance between which components within PCB chamber 305 and components within driver chamber 304a may be located away from each other in order to prevent the light sources' heat from combining with the driver's heat in a manner that raises the temperature internal to light fixture 300 above a temperature threshold. Once the driver distance threshold is determined, driver chamber 304a may be sized such that driver 360 is placed at least the driver distance threshold away from PCB chamber 305. The driver distance threshold may be contingent on whether and how portions of driver chamber 304a are thermally insolated, on the heat dissipation of driver chamber 304a into the outside environment, on the heat dissipation of PCB chamber into the outside environment, and/or the like, and/or any combination thereof. As such, all such parameters may be taken into consideration when determining the driver distance threshold. Further, the driver distance threshold may affect the light source distance threshold, and vice versa. Thus, in some embodiment, the driver distance threshold may be considered when determining the light source distance threshold, and vice versa.

Driver chamber 304 may lack traditional heat dissipation devices such as secondary heat dissipation devices. Some examples of secondary heat dissipation devices which may be omitted from driver chamber 304 may include heat sinks, fans, thermal gel, cooling gel and liquids, excessive or oversized housings and/or the like, and/or any combination thereof.

In the examples above, driver chamber 304 is discussed as housing driver 360. However, the embodiments of the disclosure should not be so limited. Driver chamber 304 may be referred to as component chamber, device chamber, and/or the like, and may house components other than drivers, if desired, such as but not limited to processors, network interfaces, communication interfaces, leads to external power supplies, AC/DC converters, DC/AC converters, and/or the like, and/or any combination thereof. In such embodiments, the sizing of the inside and outside of driver chamber 304 may be contingent on the devices housed therein and the driver threshold distance may be contingent at least in part on the devices housed therein, and the heat they generate.

Figure 4A:
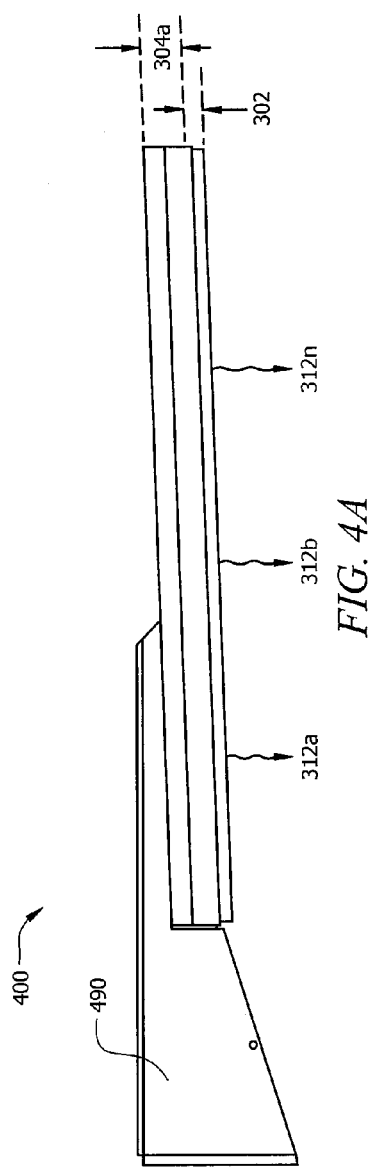
FIG. 4a shows a side view of an embodiment of a lighting fixture.
Figure 4B:
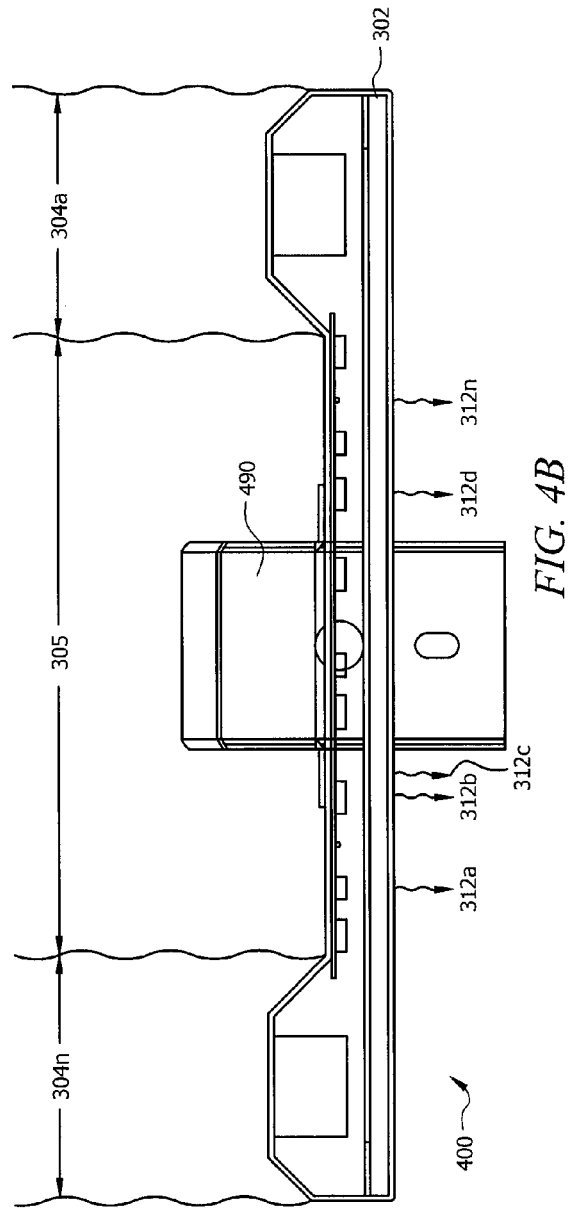
FIG. 4b shows a front view of an embodiment of a lighting fixture.

FIGS. 4a and 4b show an example of the outside side view and outside front view, respectively, of light fixture 400, which is similar to light fixture 300. Seeing the design of the outside of light fixture 400 aids in understanding additional benefits of light fixture 400's shape and design. Light fixture 400 comprises an outer casing which may be made fully or partially of a thermal conductive material that dissipates heat into the exterior environment. Light fixture 400 may also comprise one or more mounts 490, which removably mounts light fixture 400 to a device which supports lighting fixture. For example, mount 490 may mount light fixture to an indoor or outdoor wall, swimming pool wall, a pole, an aircraft, a maritime vehicle, a motor vehicle such as a car or truck, and/or any structure capable of receiving mount 490. Further, mount 490 may be retrofitted for use with existing structures. For example, an existing pole currently being used for a traditional stadium lighting fixture may be capable of receiving mount 490 as long as mount 490 is retrofitted to attach to the existing pole while at the same time adapted to secure light fixture 400.

In preferred embodiments, light fixture 400 may be used in commercial outdoor lighting, such as but not limited to street lighting, highway lighting, stadium lighting, parking lot lighting, and/or the like. As such, mount 409 may be mounted to a very tall pole, for example, a 15 feet to 60 feet tall pole. Thus, minimizing the weight and size of light fixture 400 may be important to decrease stress on the pole (or other structure), decrease stress on mount 490, decrease stress on a fastening means which affixes mount 490 to the structure (e.g., one or more screws, bolts, fasteners, affixers, clamps, rivets, nails, secures, attaches, locks, holds, seals, springs, vices, gravity, pulleys vacuum, and/or the like, and/or any combination thereof). Further, minimizing the weight and size of light fixture 400 makes light fixture 400 less cumbersome to handle when installing, repairing, and replacing, especially when light fixture 400 is mounted 15 to 60 feet in the air, or more.

Further, the non-permanent fastening of various components of light fixture 400, as discussed above, make installing, repairing, and replacing portions of light fixture 400 easier, more cost effective, and less cumbersome, especially when the light fixture is mounted 15 to 60 feet in the air because smaller parts of lighting module 400 may be worked on at any given time, and portions of light fixture 400 may be reused when other portions of light fixture 400 malfunction. In embodiments described above, light fixture 400 operates to dissipate heat without secondary heat dissipation devices, such as heat sinks, fans, and the like. As such, with the omission of these additional devices, light fixture 400 is made smaller and lighter and with less moving parts.

Further, the low profile shape of the PCB chamber provides a light fixture which is more aerodynamic as compared to traditional lighting fixtures. Light fixture's 400 aerodynamic profile helps light fixture 400 meet and exceed codes and standards implemented by cities regarding wind, earthquakes, terrorist attacks, and other natural and/or non-natural environmental disasters. For example, hurricane zones have building code requirements regarding commercial lighting fixtures ability to withstand a threshold mount of wind speeds, and the aerodynamic profile of light fixture 400 meet and exceed hurricane and tropical storm building codes.

In short, some embodiments herein describe a light fixture with a unique design that not only effectively solves the problem of heat dissipation but also results in a distinct configuration that aids in field replacement of the light fixture or component thereof and a unique shape which protects the light fixture from environmental damage. Although the present invention and its advantages have been described in detail, it should be understood that various changes, substitutions and alterations may be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lighting fixture comprising:
   at least one printed circuit board (PCB) with at least one light emitting diode disposed on a first surface of said PCB;
   at least one thermal heat conduit disposed on said first surface;
   at least one additional thermal heat conduit disposed on a second surface of said PCB;
   at least one thermal via connecting said thermal heat conduit to said additional thermal heat conduit;
   at least one additional PCB with at least one light emitting diode disposed on a first surface of said additional PCB;
   at least one thermal heat conduit disposed on said first surface of said additional PCB;
   at least one additional thermal heat conduit disposed on a second surface of said additional PCB;
   at least one additional thermal via connecting each said at least one additional thermal heat conduit disposed on said first surface of said at least one additional PCB to said at least one additional thermal heat conduit disposed on said second surface of said at least one additional PCB; and
   a housing operable to provide structural support and environmental protection to said PCB and said at least one additional PCB, wherein said housing comprises:
      at least one thermal conductive housing contact operable to draw heat away from said additional thermal heat conduit and further operable to dissipate said heat into an environment outside said housing, wherein said at least one thermal conductive housing contact is further operable to draw heat away from said at least one additional thermal heat conduit on said at least one additional PCB and further operable to dissipate said heat from said at least one additional thermal heat conduit into an environment outside said housing, and wherein said PCB and said at least one additional PCB are field replaceable without damaging other components of the lighting fixture;
      at least one PCB chamber operable to house said PCB and said at least one additional PCB inside the PCB chamber; and
      at least one driver chamber operable to house at least one driver inside the driver chamber, wherein said driver chamber is thermally independent from said PCB chamber.

2. The lighting fixture of claim 1 further comprising:
   a driver located in said driver chamber and operable to drive said PCB; and
   at least one additional thermal conductive housing contact in thermal connection with said driver, wherein said additional thermal conductive housing contact is operable to draw heat away from said driver and further operable to dissipate said heat into an environment outside said housing.

3. The lighting fixture of claim 1, wherein thermal independence between said driver chamber and said PCB chamber is created by placing the PCB chamber at least a threshold distance apart from the driver chamber.

4. The lighting fixture of claim 3 wherein said lighting fixture is configurable such that one or more of said PCB chambers are operable to be added or removed from said lighting fixture and one or more of said driver chambers are operable to be added or removed from said lighting fixture.

5. The lighting fixture of claim 1 wherein said housing seals components housed therein from said environment outside said housing.

6. The lighting fixture of claim 1 wherein said at least one thermal conductive housing contact is placed on said second surface of said PCB and in direct contact with said additional thermal heat conduit.

7. The lighting fixture of claim 1 wherein thermal independence between said driver chamber and said PCB chamber is created by placing a thermal isolation material between the driver chamber and the PCB chamber.

8. The lighting fixture of claim 3 further comprising a plurality of light emitting diodes disposed on said first surface of said PCB, wherein the threshold distance between the driver chamber and the PCB chamber is determined based at least on a distance between two of the plurality of light emitting diodes.

9. A method of dissipating heat from a lighting fixture comprising:
providing at least one printed circuit board (PCB) with a plurality of light emitting diodes disposed on a first surface of said PCB;
disposing at least one thermal heat conduit on said first surface;
disposing at least one additional thermal heat conduit on a second surface of said PCB;
connecting, by a via, said at least one thermal heat conduit to said additional thermal heat conduit; and
providing, by a housing, structural support and environmental protection to said PCB, wherein said housing comprises:
at least one thermal conductive housing contact operable to draw heat away from said additional thermal heat conduit and further operable to dissipate said heat into an environment outside said housing;
at least one PCB chamber operable to house said PCB inside the PCB chamber; and
at least one driver chamber operable to house at least one driver inside the driver chamber, wherein said driver chamber is thermally independent from said PCB chamber, wherein said thermal independence between said driver chamber and said PCB chamber is created by placing the PCB chamber at least a threshold distance apart from the driver chamber, and wherein the threshold distance between the driver chamber and the PCB chamber is determined based at least on a distance between two or more of the plurality of light emitting diodes.

10. The method of claim 9 further comprising:
locating a driver, operable to drive said PCB, in said driver chamber; and
disposing at least one additional thermal conductive housing contact in thermal connection with said driver, wherein said additional thermal conductive housing contact is operable to draw heat away from said driver and further operable to dissipate said heat into an environment outside said housing.

11. The method of claim 9 further comprising:
configuring said lighting fixture by adding or removing one or more said PCB chambers from or adding or removing one or more said driver chambers.

12. The method of claim 9 further comprising:
providing at least one additional PCB with at least one light emitting diode disposed on a first surface of said additional PCB;
disposing at least one thermal heat conduit on said first surface of said at least one additional PCB;
disposing at least one additional thermal heat conduit on a second surface of said at least one additional PCB; and
connecting, by at least one additional thermal via, each said at least one thermal heat conduit disposed on said first surface of said at least one additional PCB to said at least one additional thermal heat conduit disposed on said second surface of said at least one additional PCB, wherein said thermal conductive housing contact is further operable to draw heat away from said at least one additional thermal heat conduit on said second surface of said at least one additional PCB and further operable to dissipate said heat into an environment outside said housing, and wherein said PCB and said at least one additional PCB are field replaceable without damaging other components of the lighting fixture.

13. The method of claim 9 wherein said housing seals components housed therein from said environment outside said housing.

14. The method of claim 9 wherein said at least one thermal conductive housing contact is placed on said second surface of said PCB and in direct contact with said additional thermal heat conduit.

15. The method of claim 9 wherein thermal independence between said driver chamber and said PCB chamber is created by placing a thermal isolation material between the driver chamber and the PCB chamber.

16. A lighting fixture comprising:
at least one printed circuit board (PCB) with at least one light emitting diode disposed on a first surface of said PCB;
at least one thermal heat conduit disposed on said first surface of said at least one PCB;
at least one additional thermal heat conduit disposed on a second surface of said at least one PCB;
means for connecting said thermal heat conduit to said additional thermal heat conduit;
at least one driver operable to drive said PCB; and
means for providing structural support and environmental protection to said at least one PCB, wherein said means for providing structural support and environmental protection comprises:
at least one thermal conductive housing contact operable to draw heat away from said at least one additional thermal heat conduit disposed on said second surface of said at least one PCB and further operable to dissipate said heat into an environment outside said housing;
at least one PCB chamber operable to house said PCB inside the PCB chamber;
at least one driver chamber operable to house said at least one driver inside the driver chamber, wherein said driver chamber is thermally independent from said PCB chamber; and
at least one additional thermal conductive housing contact in thermal connection with said driver, wherein said at least one additional thermal conductive housing contact is operable to draw heat away from said driver and further operable to dissipate said heat into an environment outside said housing.

17. The lighting fixture of claim 16 wherein said at least one PCB is field replaceable without damaging other components of the lighting fixture.

* * * * *